United States Patent
Hsu et al.

(10) Patent No.: US 11,631,613 B2
(45) Date of Patent: Apr. 18, 2023

(54) SEMICONDUCTOR DEVICE

(71) Applicant: United Microelectronics Corp., Hsinchu (TW)

(72) Inventors: Chih-Kai Hsu, Tainan (TW); Ssu-I Fu, Kaohsiung (TW); Chia-Jung Hsu, Tainan (TW); Chun-Ya Chiu, Tainan (TW); Chin-Hung Chen, Tainan (TW); Yu-Hsiang Lin, New Taipei (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 163 days.

(21) Appl. No.: 17/185,443

(22) Filed: Feb. 25, 2021

(65) Prior Publication Data

US 2021/0202308 A1   Jul. 1, 2021

Related U.S. Application Data

(63) Continuation of application No. 16/569,544, filed on Sep. 12, 2019, now Pat. No. 10,971,397.

(30) Foreign Application Priority Data

Aug. 13, 2019  (CN) .......................... 201910743194.7

(51) Int. Cl.
*H01L 27/146*   (2006.01)
*H01L 21/768*   (2006.01)
*H01L 27/108*   (2006.01)

(52) U.S. Cl.
CPC .. *H01L 21/76877* (2013.01); *H01L 21/76897* (2013.01); *H01L 27/10873* (2013.01)

(58) Field of Classification Search
CPC ......... H01L 27/14643; H01L 27/14605; H01L 27/14689; H01L 27/14612; H01L 27/10876; H01L 21/76877; H01L 21/76897
See application file for complete search history.

(56) References Cited

U.S. PATENT DOCUMENTS

| | | |
|---|---|---|
| 6,476,488 B1 | 11/2002 | Jeng et al. |
| 7,479,452 B2 | 1/2009 | Chien |
| 7,498,188 B2 | 3/2009 | Fan et al. |

(Continued)

FOREIGN PATENT DOCUMENTS

CN             105552097          5/2016

*Primary Examiner* — Caridad Everhart
(74) *Attorney, Agent, or Firm* — J.C. Patents

(57) ABSTRACT

Provided is a semiconductor device, including a substrate including a pixel region, a gate structure on the substrate in the pixel region, wherein the gate structure comprises a gate dielectric layer and a gate conductive layer on the gate dielectric layer; a dielectric layer located over the substrate and the gate structure; and a contact located in the dielectric layer and electrically connected to the gate conductive layer. The contact includes a doped polysilicon layer in contact with the gate conductive layer; a metal layer located on the doped polysilicon layer, wherein a part of the metal layer is embedded in the doped polysilicon layer; a barrier layer located between the metal layer and the doped polysilicon layer; and a metal silicide layer located between the barrier layer and the doped polysilicon layer.

18 Claims, 6 Drawing Sheets

(56) References Cited

U.S. PATENT DOCUMENTS

| | | | |
|---|---|---|---|
| 8,872,248 B2* | 10/2014 | Pan | H01L 27/0629 |
| | | | 257/532 |
| 10,971,397 B2* | 4/2021 | Hsu | H01L 27/14636 |
| 2003/0160715 A1 | 8/2003 | Maeda et al. | |
| 2009/0050984 A1 | 2/2009 | Balasubramanian | |
| 2012/0043592 A1* | 2/2012 | Zhao | H01L 23/53266 |
| | | | 438/653 |
| 2017/0213862 A1 | 7/2017 | Kamino et al. | |
| 2018/0182802 A1 | 6/2018 | Tange et al. | |
| 2018/0269252 A1 | 9/2018 | Qi | |

* cited by examiner

SEMICONDUCTOR DEVICE

CROSS REFERENCE TO RELATED APPLICATIONS

This application is a continuation application of and claims the priority benefit of a prior application Ser. No. 16/569,544, filed on Sep. 12, 2019, now allowed, which claims the priority benefit of China application Ser. No. 201910743194.7, filed on Aug. 13, 2019. The entirety of each of the above-mentioned patent applications is hereby incorporated by reference herein and made a part of this specification.

BACKGROUND OF THE INVENTION

Field of the Invention

The invention relates to an integrated circuit and a method of fabricating the same, and more particularly to a semiconductor device and a method of fabricating the same.

Description of Related Art

Advanced semiconductor processes often use metal and metal silicide to reduce the sheet resistance between a contact and the source and drain regions. However, if a complementary image sensor uses metal and metal silicide, metal contamination readily occurs, such that dark current is increased.

SUMMARY OF THE INVENTION

The invention provides a semiconductor device and a method of fabricating the same that may avoid the issue of an increase in dark current caused by metal contamination.

An embodiment of the invention provides a semiconductor device, including a substrate having a pixel region, a gate structure on the substrate in the pixel region, wherein the gate structure comprises a gate dielectric layer and a gate conductive layer on the gate dielectric layer; a dielectric layer located over the substrate and the gate structure; and a contact located in the dielectric layer and electrically connected to the gate conductive layer. The contact includes a doped polysilicon layer in contact with the gate conductive layer; a metal layer located on the doped polysilicon layer, wherein a part of the metal layer is embedded in the doped polysilicon layer; a barrier layer located between the metal layer and the doped polysilicon layer; and a metal silicide layer located between the barrier layer and the doped polysilicon layer.

An embodiment of the invention also provides a semiconductor device including a substrate having a pixel region and a logic region; a first gate structure comprising a first gate conductive layer over the substrate in the pixel region; a second gate structure comprising a second gate conductive layer over the substrate in logic region; a dielectric layer located on the substrate, the first gate structure and the second gate structure; a first contact located in the dielectric layer and electrically connected to the first conductive layer; a second contact located in the dielectric layer and electrically connected to the second conductive layer. The first contact is different from the second contact, and the first contact includes a doped polysilicon layer in contact with the first conductive layer; a first metal layer located on the doped polysilicon layer, wherein a part of the first metal layer is embedded in the doped polysilicon layer; a first barrier layer located between the first metal layer and the doped polysilicon layer; and a first metal silicide layer located between the first barrier layer and the doped polysilicon layer.

An embodiment of the invention further provides a contact including: a doped polysilicon layer embedded in a dielectric layer over and in contact with a polysilicon gate layer; a metal layer located on the doped polysilicon layer, wherein a bottom part of the metal layer is embedded in the doped polysilicon layer; a barrier layer located between a bottom surface of the metal layer and a top surface the doped polysilicon layer and located between a sidewall of the metal layer and the dielectric layer; and a metal silicide layer located between a bottom surface of the barrier layer and the top surface of the doped polysilicon layer.

Based on the above, the semiconductor device and the method of fabricating the same according to an embodiment of the invention may avoid the issue that dark current is increased due to metal contamination.

In order to make the aforementioned features and advantages of the disclosure more comprehensible, embodiments accompanied with FIGURES are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

FIG. 1A to FIG. 1K are cross-sectional views showing the flow of a method of fabricating a semiconductor device according to an embodiment of the invention.

Figure 1A:
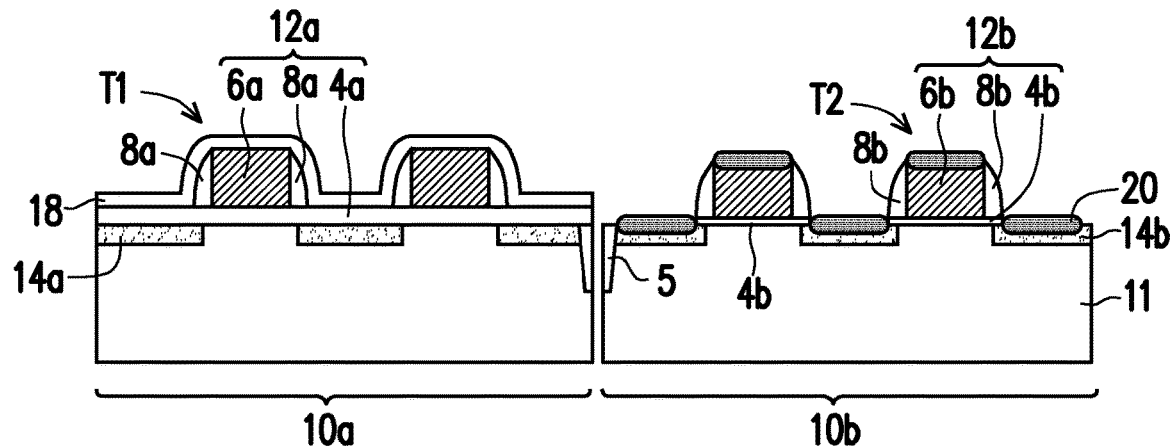
FIG. 1A to FIG. 1K are cross-sectional views showing the flow of a method of fabricating a semiconductor device according to an embodiment of the invention.

Referring to FIG. 1A, a substrate 11 is provided. The substrate 11 may be a doped silicon substrate, an undoped silicon substrate, a silicon-on-insulator (SOI) substrate, or an epitaxial substrate. The silicon-doped dopant may be a P-type dopant, an N-type dopant, or a combination thereof. Isolation structures 5 are formed in the substrate 11 to define active regions in the substrate 11. The active regions include a first region 10a and a second region 10b. The first region 10a is, for example, a pixel region; and the second region 10b is, for example, a logic region. The material of the isolation structures 5 includes an insulating material. The insulating material is, for example, silicon oxide, silicon nitride, or a combination thereof. The isolation structures 5 are formed by, for example, a shallow trench isolation structure (STI) method.

Referring further to FIG. 1A, there are a first conductive region 100a and a second conductive region 100b in the first region 10a and the second region 10b, respectively. The first conductive region 100a and the second conductive region 100b may respectively be a semiconductive layer or a doped semiconductive layer, for example, a gate conductive layer or a doped region of the substrate. In the present embodiment, the first region 10a and the second region 10b have a first transistor T1 and a second transistor T2 thereon, respectively. The first transistor T1 includes a first gate structure 12a and doped regions 14a. The first transistor T2 includes a second gate structure 12b and doped regions 14b. The first gate structure 12a and the second gate structure 12b are respectively located on the first region 10a and the second region 10b of the substrate 11. The first gate structure 12a includes a gate dielectric layer 4a, a conductive layer 6a, and spacers 8a located on the substrate 11. The second gate structure 12b includes a gate dielectric layer 4b, a conductive layer 6b, and spacers 8a located on the substrate 11.

The gate dielectric layers 4a and 4b are formed on the substrate 11 of the first region 10a and the second region 10b, respectively. The material of the gate dielectric layers 4a and 4b may be silicon oxide, silicon nitride, a high-dielectric constant material having a dielectric constant greater than 4, or a combination thereof. The high-dielectric constant material may be a metal oxide such as a rare earth metal oxide. The rare earth metal oxide is, for example, hafnium oxide ($HfO_2$), hafnium silicon oxide (HfSiO), hafnium silicon oxynitride (HfSiON), aluminum oxide ($Al_2O_3$), yttrium oxide, ($Y_2O_3$), lanthanum oxide ($La_2O_3$), lanthanum aluminum oxide (LaAlO), tantalum oxide ($Ta_2O_5$), zirconium oxide ($ZrO_2$), zirconium silicon oxide ($ZrSiO_4$), hafnium zirconium oxide (HfZrO), strontium bismuth tantalate ($SrBi_2Ta_2O_9$, SBT), or a combination thereof. The gate dielectric layers 4a and 4b are formed by, for example, chemical vapor deposition or atomic layer deposition (ALD).

The gate conductive layers 6a and 6b are formed on the gate dielectric layers 4a and 4b, respectively. The material of the conductive layers 6a and 6b may be a semiconductor material, a metal material, a metal alloy material, or a combination thereof. The semiconductor material is, for example, doped polysilicon, undoped polysilicon, amorphous silicon, a silicon-germanium material, or a combination thereof. The metal material may be a metal or a metal compound such as copper, aluminum, tantalum, tungsten, tantalum nitride, or titanium nitride. The metal alloy material is, for example, tungsten, titanium, cobalt, or an alloy formed by nickel and polysilicon or a copper-aluminum alloy, which is formed by, for example, physical vapor deposition, chemical vapor deposition, or atomic layer deposition.

The spacers 8a are formed on the sidewall of the first gate structure 12a and on the surface of the gate dielectric layer 4a; and the spacers 8b are formed on the sidewall of the second gate structure 12b and on the surface of the gate dielectric layer 4b. The spacers 8a and 8b may be single-layer or multilayer structures, respectively. The material of the spacers 8a and 8b may include silicon oxide, silicon nitride, or a combination thereof formed by thermal oxidation, chemical vapor deposition, or atomic layer deposition. The spacers 8a and 8b may be formed by first forming a spacer material layer and then performing an anisotropic etching process.

The doped regions 14a and 14b are formed in the substrate 11 of the first region 10a and the second region 10b, respectively. The doped regions 14a and 14b may be used as source and drain regions. The doped regions 14a and 14b may be formed by an ion implantation process, respectively. The doped regions 14a and 14b may have a first conductivity-type dopant or a second conductivity-type dopant. The first conductivity-type dopant may be an N-type dopant; and the second conductivity-type dopant may be a P-type dopant. The N-type dopant is, for example, phosphorus or arsenic; and the P-type dopant is, for example, boron, boron fluoride ($BF_2$), indium (In), or a combination thereof.

In the present embodiment, the first conductive region 100a is, for example, a gate conductive layer 6a of the first transistor T1 and/or the doped region 14a. The second conductive region 100b is, for example, a gate conductive layer 6b of the second transistor T2 and/or the doped region 14b.

A block layer 18 is formed on the substrate 11 of the first region 10a. The block layer 18 covers the first transistor T1, exposing the second gate structure 12b and the doped regions 14b of the second transistor T2 on the second region 10b. The block layer 18 may be a single layer or multiple layers. The material of the block layer 18 may include silicon oxide, silicon nitride, or a combination thereof formed by chemical vapor deposition. The block layer 18 is formed by, for example, first forming a block material layer covering the first transistor T1 in the first region 10a and the second transistor T2 in the second region 10b. Then, a mask layer is formed on the block material layer of the first region 10a by a lithography process. The mask layer is, for example, a photoresist layer. Next, an etching process is performed to remove the block material layer on the second region 10b. The mask layer is then removed. The mask layer may be removed by dry removal or wet removal.

Referring further to FIG. 1A, a metal silicide layer 20 is formed on the gate conductive layer 6b and the doped regions 14b of the second gate structure 12b. The metal silicide layer 20 is formed by, for example, first forming a metal layer on the substrate 11, and then performing a self-aligned silicide (salicide) process to form the metal silicide layer 20. The material of the metal layer may be titanium, molybdenum, cobalt, nickel, platinum, or tungsten. The metal layer is formed by, for example, physical vapor deposition. Since the gate conductive layer 6a and the doped regions 14a of the first gate structure 12a are covered by the block layer 18, a metal silicide layer is not formed thereon.

Figure 1B:
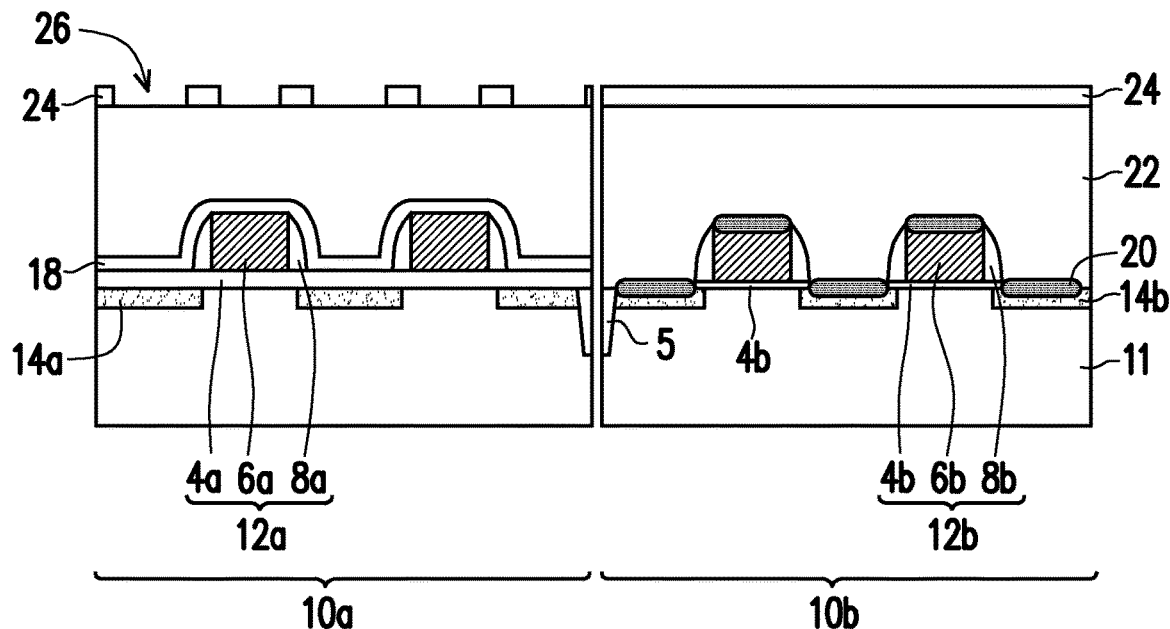

Referring to FIG. 1B, after the metal silicide layer 20 is formed, a dielectric layer 22 is formed on the substrate 11. The dielectric layer 22 covers the block layer 18, the spacers 8b, and the metal silicide layer 20. The dielectric layer 22 is also referred to as an interlayer dielectric (ILD). The dielectric layer 22 may be a single layer or multiple layers. The material of the dielectric layer 22 is, for example, silicon oxide, silicon nitride, a low-dielectric constant material having a dielectric constant of less than 4, or a combination thereof. The forming method is, for example, chemical vapor deposition or spin coating.

Figure 1C:
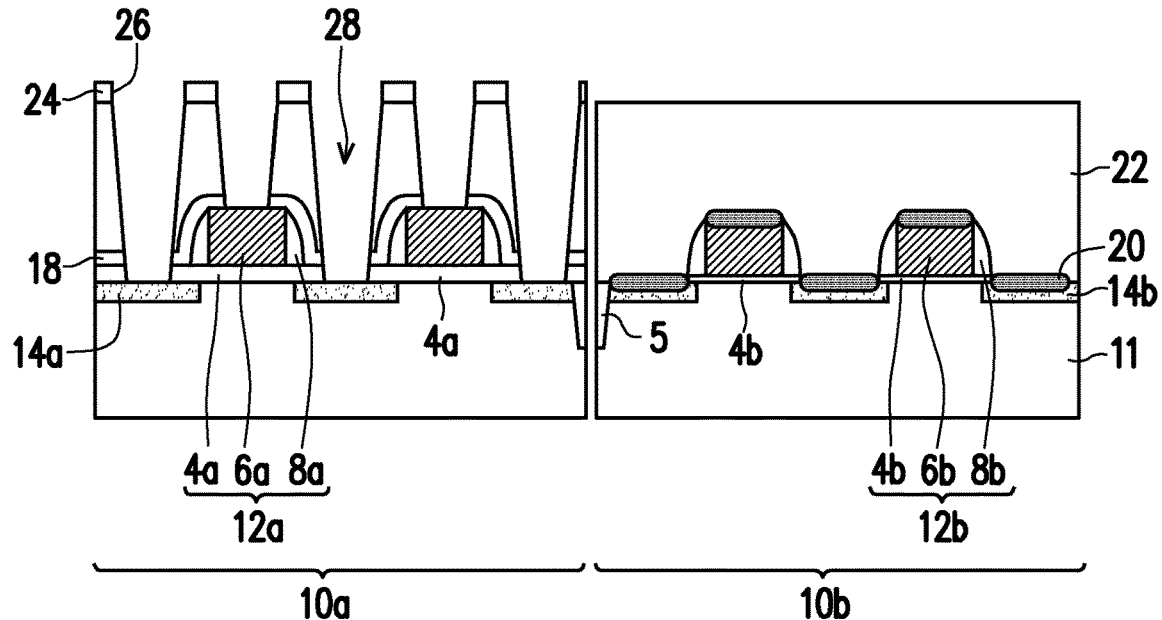

Referring to FIGS. 1B and 1C, first contact openings 28 are formed in the dielectric layer 22 of the first region 10a. The first contact openings 28 also pass through the block layer 18 and the gate dielectric layer 4a, exposing the gate conductive layer 6a and the doped region 14a. The gate conductive layer 6a and the doped regions 14a exposed by the first contact openings 28 do not contain a metal silicide layer and are not covered by the metal silicide layer. The first contact openings 28 are formed by, for example, forming a mask layer 24 on the dielectric layer 22. The mask layer 24 has openings 26 exposing parts of the dielectric layer 22 in the first region 10a. The mask layer 24 is, for example, a patterned photoresist layer formed by a lithography process. After the mask layer 24 is formed, an anisotropic etching process is performed to remove the dielectric layer 22 exposed by the openings 26 and the barrier layer 18 and the gate dielectric layer 4a thereunder until the gate conductive layer 6a and the doped regions 14a are exposed. Then, the mask layer 24 is removed. The mask layer 24 may be removed by dry removal or wet removal.

Figure 1D:
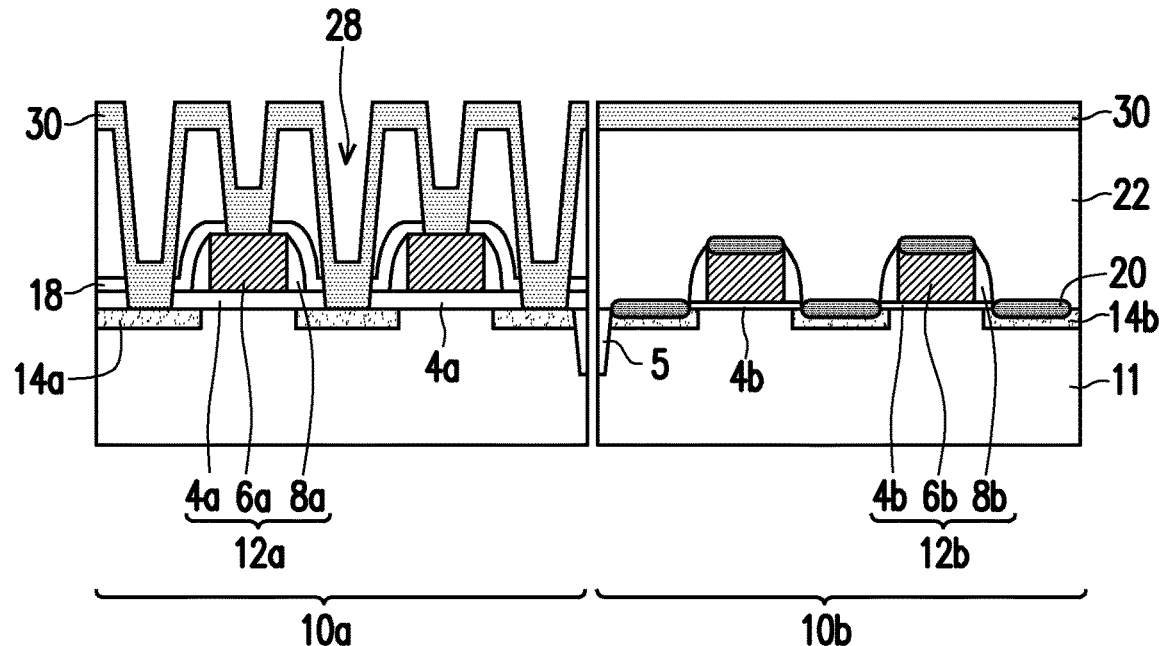

Referring to FIG. 1D, a conformal doped polysilicon layer 30 is formed on the first region 10a and the second region 10b of the substrate 11. In the first region 10a, the doped polysilicon layer 30 covers the dielectric layer 22 and is filled in the first contact openings 28 to cover the bottom surfaces and the sidewalls of the first contact openings 28. In the second region 10b, the doped polysilicon layer 30 covers the dielectric layer 22. The doped polysilicon layer 30 is formed by, for example, chemical vapor deposition. The dopant of the doped polysilicon layer 30 may be in-situ doped during deposition or formed by an ion implantation process after deposition. The doped polysilicon layer 30 has a high doping concentration. The doping concentration of the doped polysilicon layer 30 is, for example, greater than $1 \times 10^{20}/cm^3$. The conductivity type of the dopant of the doped polysilicon layer 30 is the same as the conductivity type of the channel between the doped regions 14a of the first transistor T1. When the first transistor T1 is an NMOS, the doped polysilicon layer 30 has an N-type dopant such as phosphorus, arsenic, or a combination thereof. When the first transistor T1 is a PMOS, the doped polysilicon layer 30 has a P-type dopant such as boron, boron fluoride ($BF_2$), indium (In), or a combination thereof.

Figure 1E:
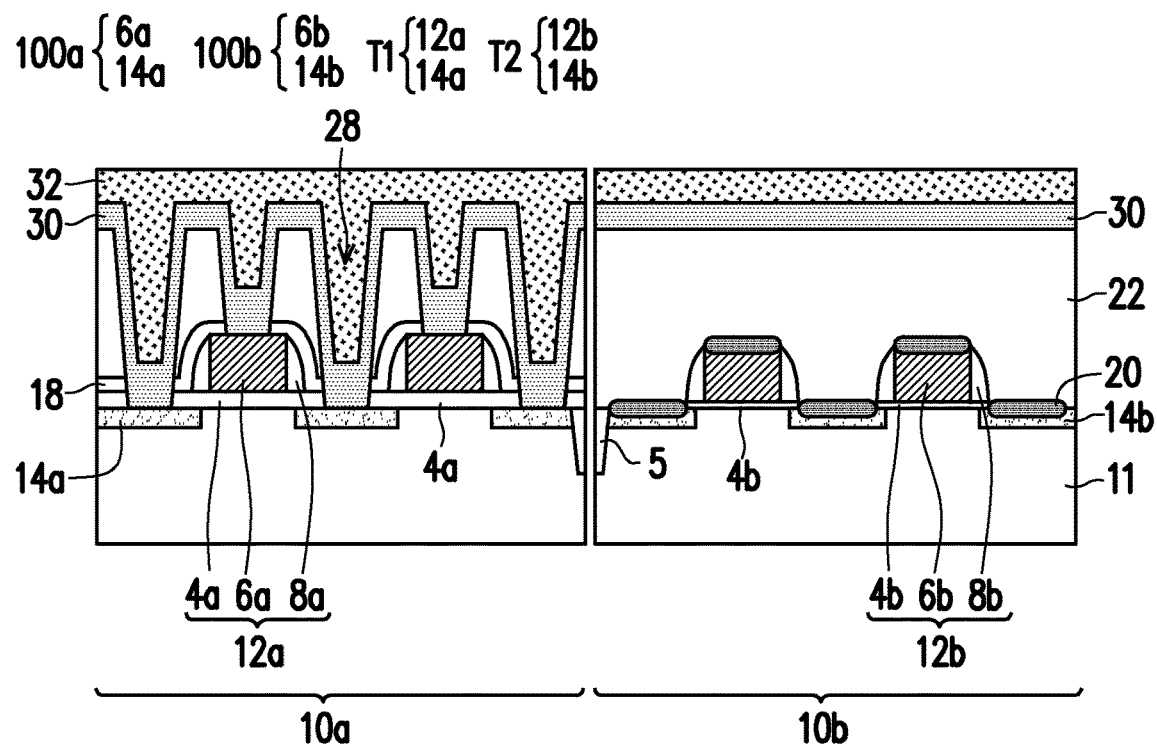

Referring to FIG. 1E, a mask material layer 32 is formed on the first region 10a and the second region 10b of the substrate 11. In the first region 10a, a mask material layer 32 covers the doped polysilicon layer 30 on the dielectric layer 22 and is filled in the first contact openings 28 to cover the doped polysilicon layer 30. In the second region 10b, the mask material layer 32 covers the doped polysilicon layer 30. The mask material layer 32 may be selected from a material that may have better gap-fill capability to completely fill the first contact openings 28 or not completely fill the first contact openings 28 to conformally cover the doped polysilicon layer 30. The material of the mask material layer 32 is different from the material of the doped polysilicon layer 30, and the mask material layer 32 and the doped polysilicon layer 30 have different etch rates. The thickness of the mask material layer 32 is related to the size of the first contact opening 28 and the etchback process of the subsequently doped polysilicon layer. The mask material layer 32 may be an organic material or an inorganic material. The organic material may be a photosensitive material or a non-photosensitive material. The organic material includes a resin, a polymer, or a photoresist. The mask material layer 32 may also be a bottom anti-reflective coating (BARC). The BARC may be any known material.

Figure 1F:
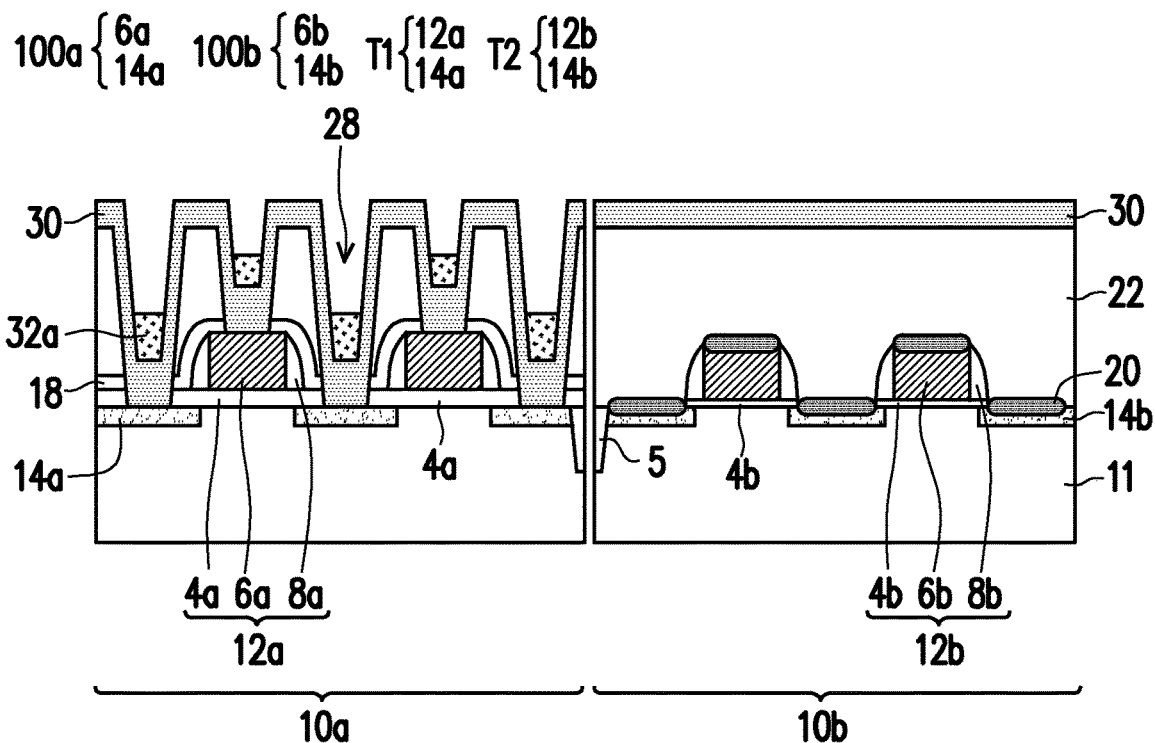

Referring to FIG. 1F, an etchback process is performed to remove the mask material layer 32 above the dielectric layer 22 and a part of the mask material layer 32 in the first contact opening 28 to form a mask layer 32a in the first contact opening 28. The mask layer 32a has a sufficient thickness to serve as a mask for the doped polysilicon layer 30 in a subsequent etchback process.

Figure 1G:
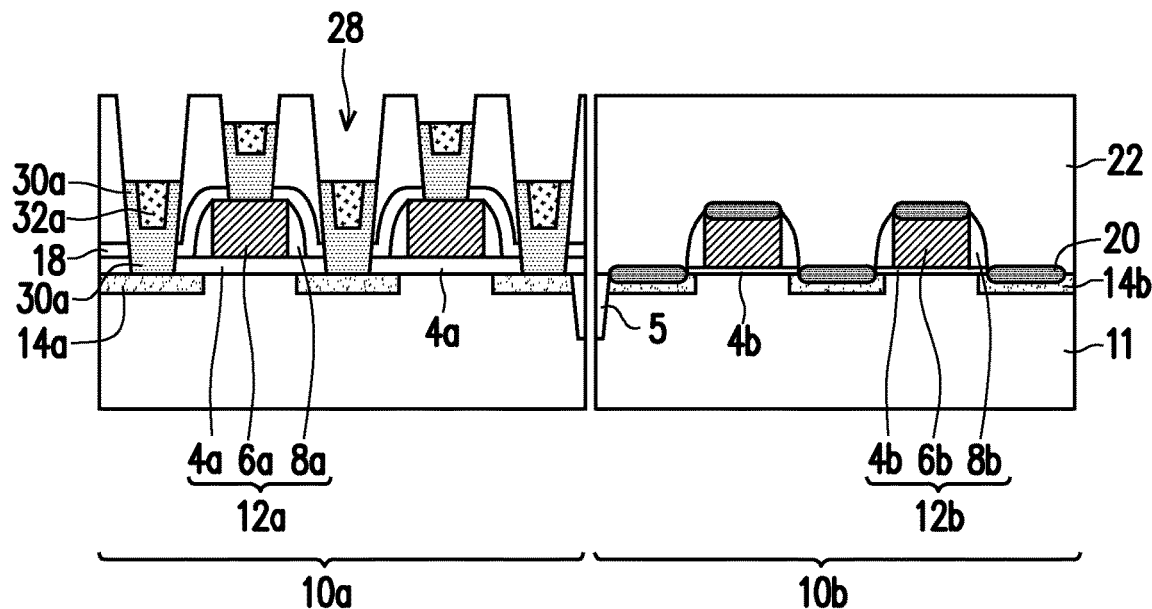

Referring to FIG. 1G, an etchback process is performed using the mask layer 32a as a mask to remove the doped polysilicon layer 30 above the dielectric layer 22 and a part of the doped polysilicon layer 30 in the first contact openings 28.

Figure 1H:
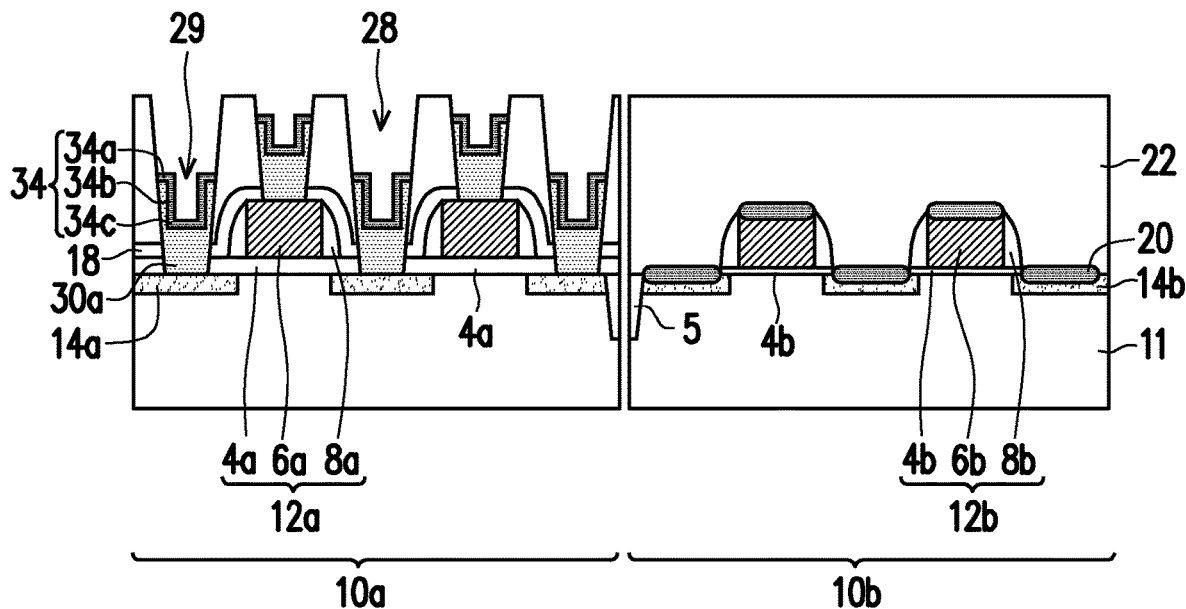

Referring to FIG. 1H, the mask layer 32a is removed to expose the doped polysilicon layer 30a. The remaining doped polysilicon layer 30a has a recess 29. In some embodiments, the profile of the doped polysilicon layer 30a is generally U-shaped. The mask layer 32a may be removed by dry removal or wet removal. Next, a metal silicide layer 34 is formed on the doped polysilicon layer 30a. The metal silicide layer 34 is formed by, for example, first forming a metal layer on the substrate 11, and then performing a salicide process to form the metal silicide layer 34. The material of the metal layer may be titanium, molybdenum, cobalt, nickel, platinum, or tungsten. The metal layer is formed by, for example, physical vapor deposition.

In some embodiments, the metal silicide layer 34 is conformal to the doped polysilicon layer 30a. The profile of the metal silicide layer 34 is, for example, substantially U-shaped. The metal silicide layer 34 may include an upper part 34a, a lower part 34c, and a connecting part 34b. The upper part 34a covers the top surface of the doped polysilicon layer 30a. The lower part 34c covers the bottom surface of the recess 29. The connecting part 34b covers the doped polysilicon layer 30a at the sidewall of the recess 29, and is longitudinally connected to the upper part 34a and the lower part 34c.

The height of the metal silicide layer 34 in the first region 10a is greater than the height of the metal silicide layer 20 at the corresponding position in the second region 10b. For example, the metal silicide layer 34 on the doped region 14a is higher than the metal silicide layer 20 on the doped region 14b. The metal silicide layer 34 on the first gate conductive layer 6a is higher than the metal silicide layer 20 on the second gate conductive layer 6b.

In some embodiments, in the first region 10a, the height of the bottom surface of the lower part 34c of the metal silicide layer 34 on the first gate conductive layer 6a is between the top surface of the dielectric layer 22 and the top surface of the first gate conductive layer 6a. In the second region 10b, the height of the bottom surface of the metal silicide layer 20 on the second gate conductive layer 6b is substantially the same as the height of the top surface of the second gate conductive layer 6b. In the first region 10a, the metal silicide layer 34 on the first gate conductive layer 6a is in contact with the doped polysilicon layer 30 and separated from the first gate conductive layer 6a and the spacers 8a. In the second region 10b, the metal silicide layer 20 on the second gate conductive layer 6b is not only in contact with the second gate conductive layer 6b, but also in contact with the spacers 8b.

In other embodiments, in the first region 10a, the height of the top surface of the upper part 34a of the metal silicide layer 34 on the doped region 14a is between the top surface of the dielectric layer 22 and the top surface of the first gate conductive layer 6a. The height of the bottom surface of the lower part 34c of the metal silicide layer 34 on the doped region 14a is between the top surface and the bottom surface of the first gate conductive layer 6a. In the second region 10b, the height of the top surface of the metal silicide layer 20 on the doped region 14b is between the top surface and the bottom surface of the first gate conductive layer 6b. The height of the bottom surface of the metal silicide layer 20 on the doped region 14b is less than the bottom surface of the second gate conductive layer 6b.

In some embodiments, in the first region 10a, the sidewall of the connecting part 34b of the metal silicide layer 34 on the doped region 14a is in contact with the doped polysilicon layer 30 and separated from the spacers 8a and the gate dielectric layer 4a. In the second region 10b, the metal silicide layer 20 on the doped region 14b is in contact with the spacers 8a and the gate dielectric layer 4a.

Figure 1I:
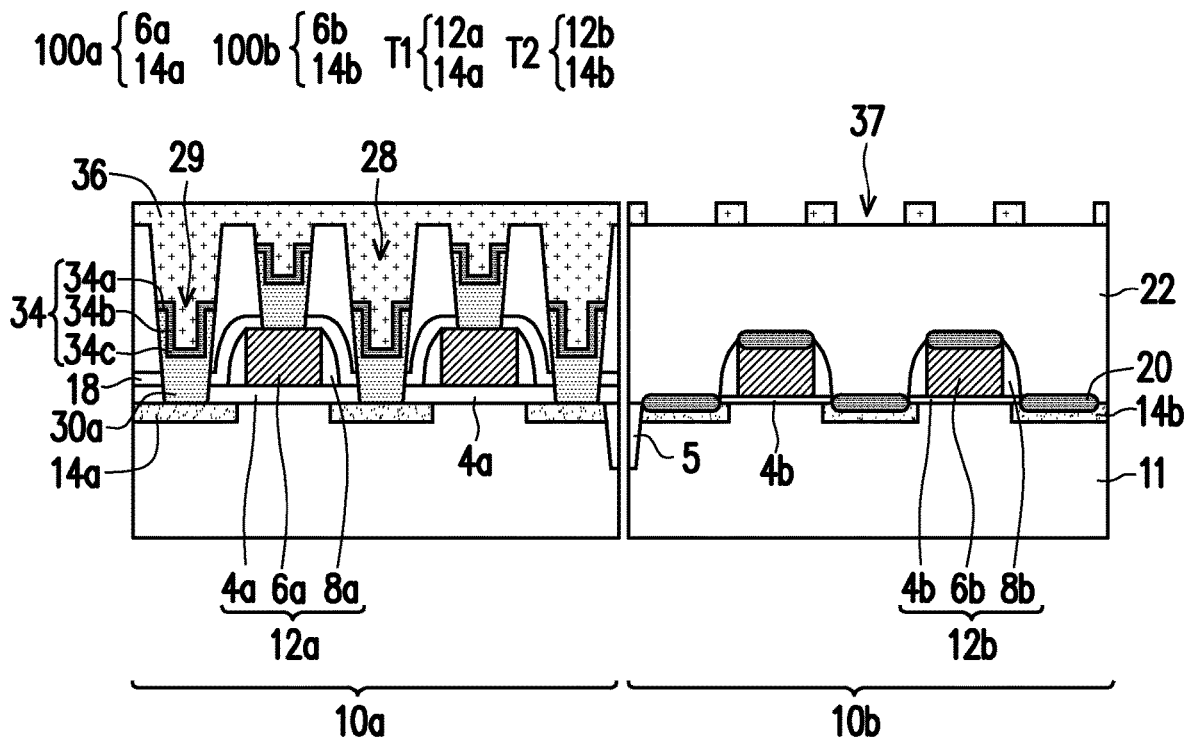
Figure 1J:
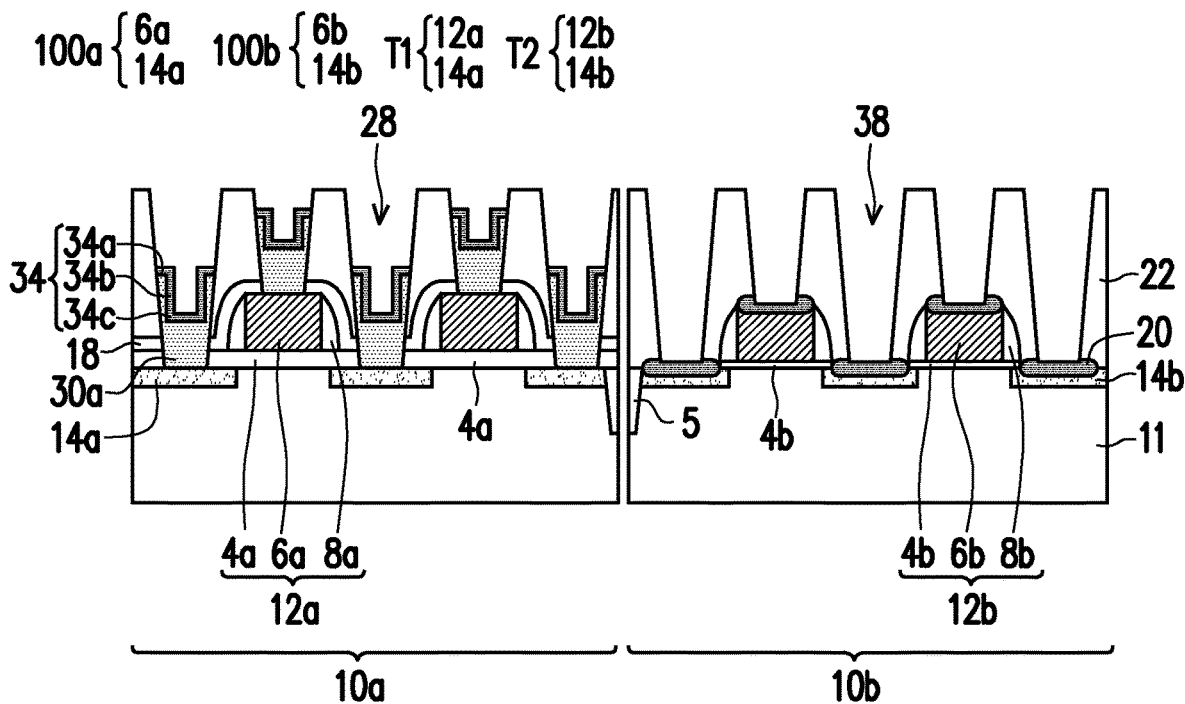

Referring to FIGS. 1I and 1J, after the metal silicide layer 34 is formed, second contact openings 38 are formed in the dielectric layer 22 of the second region 10b. The second contact openings 38 are formed by, for example, the following method. A mask layer 36 is formed on the dielectric layer 22. The mask layer 36 covers the dielectric layer 22 on the first region 10a and is filled in the first contact openings 28 to cover the metal silicide layer 34. The mask layer 36 has openings 37 exposing a part of the dielectric layer 22 in the second region 10b. The mask layer 36 is, for example, a patterned photoresist layer formed by a lithography process. After the mask layer 36 is formed, an anisotropic etching process is performed to remove the dielectric layer 22 exposed by the openings 37 to expose the gate conductive layer 6b and the metal silicide layer 20 on the doped region 14b. Next, the mask layer 36 is removed. The mask layer 36 may be removed by dry removal or wet removal.

Figure 1K:
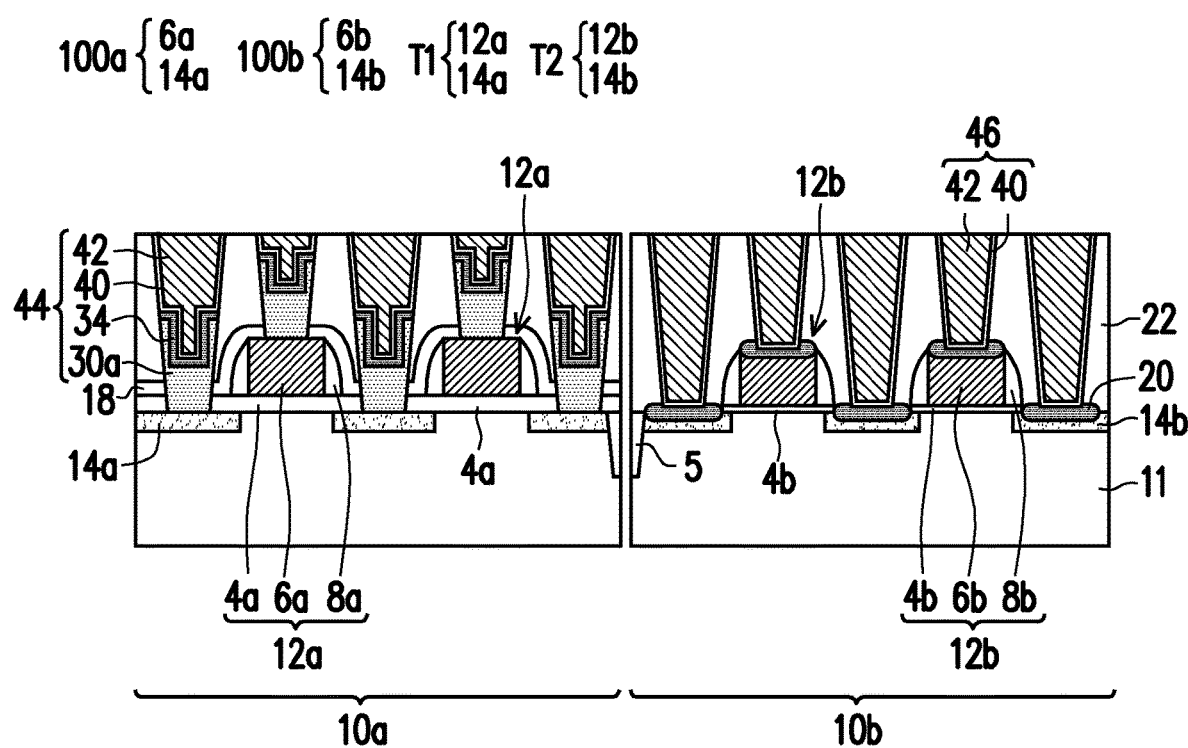

Referring to FIGS. 1J and 1K, a barrier layer 40 and a metal layer 42 are formed in the first contact opening 28 and the second contact opening 38. The barrier layer 40 and the metal layer 42 are formed by the following, for example. A barrier material layer and a metal material layer are formed on the substrate 11 to completely fill the first contact opening 28 and the second contact opening 38. Next, the barrier material layer and the metal material layer on the dielectric layer 22 are removed. The removal of the barrier material layer and the metal material layer on the dielectric layer 22 may be performed by an etchback process or a chemical mechanical polishing process (CMP).

The barrier layer 40 may be a conformal layer. The barrier layer 40 may be a single layer or a double layer. The material of the barrier layer 40 includes metal, metal nitride, or a combination thereof. The material of the barrier layer 40 is tantalum, titanium, tantalum nitride, titanium nitride, or other suitable materials. The barrier layer 40 may be formed by physical vapor deposition, chemical vapor deposition, or a combination thereof. The metal layer 42 includes tungsten, copper, or other suitable materials. The metal layer 42 may be formed by physical vapor deposition, chemical vapor deposition, or a combination thereof.

The profile of the barrier layer 40 in the first contact opening 28 is different from the profile of the barrier layer 40 in the second contact opening 38. The sidewall of the barrier layer 40 in the first contact opening 28 is stepped. The cross section of the barrier layer 40 in the second contact opening 38 has a U-shaped profile. The barrier layer 40 in the first contact opening 28 covers the upper sidewall of the first contact opening 28, the upper part 34a of the metal silicide layer 34, the connecting part 34b, and the lower part 34c, and does not cover the lower sidewall and the bottom part the first contact opening 28. The barrier layer 40 in the second contact opening 38 covers the upper sidewall, the lower sidewall, and the bottom part of the second contact opening 38. Moreover, the barrier layer 40 in the first contact opening 28 completely covers the top surface of the metal silicide layer 34. The barrier layer 40 in the second contact opening 38 does not completely cover the top surface of the metal silicide layer 20, and the top surface of a part of the metal silicide layer 20 is not covered by the barrier layer 40.

The metal layer 42 in the first contact opening 28 has a T-shape, is embedded in the barrier layer 40 having a stepped sidewall, and is partially embedded in the doped polysilicon layer 30a having a U-shape. The metal layer 42 in the second contact opening 38 is embedded in the barrier layer 40 having a U-shaped profile.

The doped polysilicon layer 30, the metal silicide layer 34, the barrier layer 40, and the metal layer 42 in the first contact opening 28 form a first contact 44. The first contact 44 may also be referred to as a hybrid contact. The barrier layer 40 and the metal layer 42 in the second contact opening 38 form a second contact 46. The doped polysilicon layer 30 of the first contact 44 is in physical contact with the doped region 14a and the first gate conductive layer 6a. The second contact 46 is electrically connected to the doped region 14b and the first gate conductive layer 6b via the metal silicide layer 20.

The metal silicide layer 34 in the first region 10a is contained in the first contact 44, covered by the barrier layer 40 on top, and is in contact with the doped polysilicon layer 30 at the bottom, and the metal silicide layer 34 is physically separated from the doped region 14a or from the first gate conductive layer 6a via the doped polysilicon layer 30. The metal silicide layer 20 in the second region 10b is not contained in the first contact 44, and is not only covered by the barrier layer 40 on top but also covered by the dielectric layer 22, and is in physical contact with the doped region 14b or the first gate conductive layer 6b at the bottom. In other words, the metal silicide layer 34 in the first region 10a is not protruded laterally from the sidewall of the first contact 44. The metal silicide layer 20 in the first region 10b is protruded laterally from the sidewall of the second contact 46, and even covers the bottom surface and the lower sidewall of the second contact 46.

Based on the above, the method of an embodiment of the invention may form different contacts on different regions of the substrate. The contact in a region of the substrate is in contact with the doped region or with the metal silicide layer on the gate conductive layer, has low sheet resistance, and may therefore be applied in the logic region. The contact in another area of the substrate is a hybrid contact. The metal silicide and the doped poly silicon layer are buried in the hybrid contact. The metal silicide is separated from the doped region or the gate conductive layer via the doped polysilicon layer to avoid an issue with a metal (such as tungsten, aluminum, nickel, and the like). Therefore, the contact of the other region may be applied to the pixel region of the complementary image sensor. Therefore, an embodiment of the invention may be applied to a complementary image sensor, wherein the logic region thereof has low sheet resistance, and the pixel region may avoid the issue of increased dark current caused by metal contamination.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A semiconductor device, comprising:
   a substrate having a pixel region;
   a gate structure on the substrate in the pixel region, wherein the gate structure comprises a gate dielectric layer and a gate conductive layer on the gate dielectric layer;
   a dielectric layer located over the substrate and the gate structure; and
   a contact located in the dielectric layer and electrically connected to the gate conductive layer, the contact comprising:
      a doped polysilicon layer in contact with the gate conductive layer;
      a metal layer located on the doped polysilicon layer, wherein a part of the metal layer is embedded in the doped polysilicon layer;
      a barrier layer located between the metal layer and the doped polysilicon layer; and
      a metal silicide layer located between the barrier layer and the doped polysilicon layer,
      wherein an entire top surface of the metal silicide layer is cover by the barrier layer.

2. The semiconductor device of claim 1, wherein the doped polysilicon layer is U-shaped; and the metal layer is T-shaped.

3. The semiconductor device of claim 2, wherein the metal silicide layer is U-shaped.

4. The semiconductor device of claim 1, wherein there is no metal silicide layer between the gate conductive layer and the doped polysilicon layer.

5. The semiconductor device of claim 1, wherein a doping concentration of the doped polysilicon layer is greater than $1 \times 10^{20}/cm^3$.

6. The semiconductor device of claim 1, further comprising a block layer located between the substrate and the dielectric layer, and the contact passes through the block layer.

7. A semiconductor device, comprising:
- a substrate, comprising a pixel region and a logic region;
- a first gate structure comprising a first gate conductive layer over the substrate in the pixel region;
- a second gate structure comprising a second gate conductive layer over the substrate in logic region;
- a dielectric layer located on the substrate, the first gate structure and the second gate structure;
- a first contact located in the dielectric layer and electrically connected to the first conductive layer;
- a second contact located in the dielectric layer and electrically connected to the second conductive layer, wherein the first contact is different from the second contact, and the first contact comprises:
  - a doped polysilicon layer in contact with the first conductive layer;
  - a first metal layer located on the doped polysilicon layer, wherein a part of the first metal layer is embedded in the doped polysilicon layer;
  - a first barrier layer located between the first metal layer and the doped polysilicon layer; and
  - a first metal silicide layer located between the first barrier layer and the doped polysilicon layer,
  - wherein an entire top surface of the first metal silicide layer is covered by the first barrier layer.

8. The semiconductor device of claim 7, further comprises:
- a second metal silicide layer located between the second contact and the second conductive layer and in contact with the second conductive gate.

9. The semiconductor device of claim 8, wherein a portion of a top surface of the second metal silicide layer is not covered by the second conductive layer.

10. The semiconductor device of claim 9, wherein the first metal silicide layer and the second metal silicide layer have different shapes.

11. The semiconductor device of claim 10, wherein the first metal silicide layer is U-shaped.

12. The semiconductor device of claim 8, wherein the second contact comprises:
- a second barrier layer in contact with the second metal silicide layer; and
- a second metal layer located on the second barrier layer.

13. The semiconductor device of claim 12, wherein the first metal layer and the second metal layer have different shapes.

14. The semiconductor device of claim 13, wherein the first metal layer is T-shaped, and the doped polysilicon layer is U-shaped.

15. The semiconductor device of claim 12, wherein the first barrier layer and the second barrier layer have different shapes.

16. The semiconductor device of claim 15, wherein the second barrier layer is U-shaped.

17. A contact, comprising:
- a doped polysilicon layer embedded in a dielectric layer over and in contact with a polysilicon gate layer;
- a metal layer located on the doped polysilicon layer, wherein a bottom part of the metal layer is embedded in the doped polysilicon layer;
- a barrier layer located between a bottom surface of the metal layer and a top surface the doped polysilicon layer and located between a sidewall of the metal layer and the dielectric layer; and
- a metal silicide layer located between a bottom surface of the barrier layer and the top surface of the doped polysilicon layer,
- wherein an entire top surface of the metal silicide layer is covered by the barrier layer.

18. The contact of claim 17, wherein a bottom width of the contact is smaller than a top width of the polysilicon gate layer.

* * * * *